(12) United States Patent
Xiao et al.

(10) Patent No.: US 11,789,358 B2
(45) Date of Patent: Oct. 17, 2023

(54) EXTREME ULTRAVIOLET MASK BLANK DEFECT REDUCTION

(71) Applicant: Applied Materials, Inc., Santa Clara, CA (US)

(72) Inventors: Wen Xiao, Singapore (SG); Vibhu Jindal, San Jose, CA (US); Weimin Li, Singapore (SG); Sanjay Bhat, Singapore (SG); Azeddine Zerrade, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 266 days.

(21) Appl. No.: 17/234,996

(22) Filed: Apr. 20, 2021

(65) Prior Publication Data
US 2021/0333703 A1 Oct. 28, 2021

(30) Foreign Application Priority Data
Apr. 23, 2020 (IN) .............................. 202041017464

(51) Int. Cl.
*G03F 1/24* (2012.01)
(52) U.S. Cl.
CPC ...................................... *G03F 1/24* (2013.01)
(58) Field of Classification Search
CPC ....................................................... G03F 1/24
USPC .............................................................. 430/5
See application file for complete search history.

(56) References Cited

U.S. PATENT DOCUMENTS

| | | | |
|---|---|---|---|
| 9,354,508 B2* | 5/2016 | Beasley | G03F 1/24 |
| 9,417,515 B2* | 8/2016 | Barman | G21K 1/062 |
| 10,209,613 B2* | 2/2019 | Beasley | G03F 1/24 |
| 11,493,841 B2* | 11/2022 | Hofmann | C03C 17/30 |
| 2007/0240453 A1 | 10/2007 | Uno et al. | |
| 2008/0311487 A1 | 12/2008 | Ito et al. | |
| 2009/0286166 A1 | 11/2009 | Sugiyama et al. | |
| 2013/0202992 A1 | 8/2013 | Chen et al. | |
| 2016/0004151 A1 | 1/2016 | Oshemkov | |
| 2016/0274454 A1 | 9/2016 | Beasley et al. | |

OTHER PUBLICATIONS

PCT International Search Report and Written Opinion in PCT/US2021/028325 dated Aug. 12, 2021, 11 pages.

* cited by examiner

*Primary Examiner* — Christopher G Young
(74) *Attorney, Agent, or Firm* — Servilla Whitney LLC

(57) ABSTRACT

Extreme ultraviolet (EUV) mask blanks and methods for their manufacture, and production systems therefor are disclosed. The method for forming an EUV mask blank comprises smoothing out surface defects on a surface of a substrate.

20 Claims, 8 Drawing Sheets

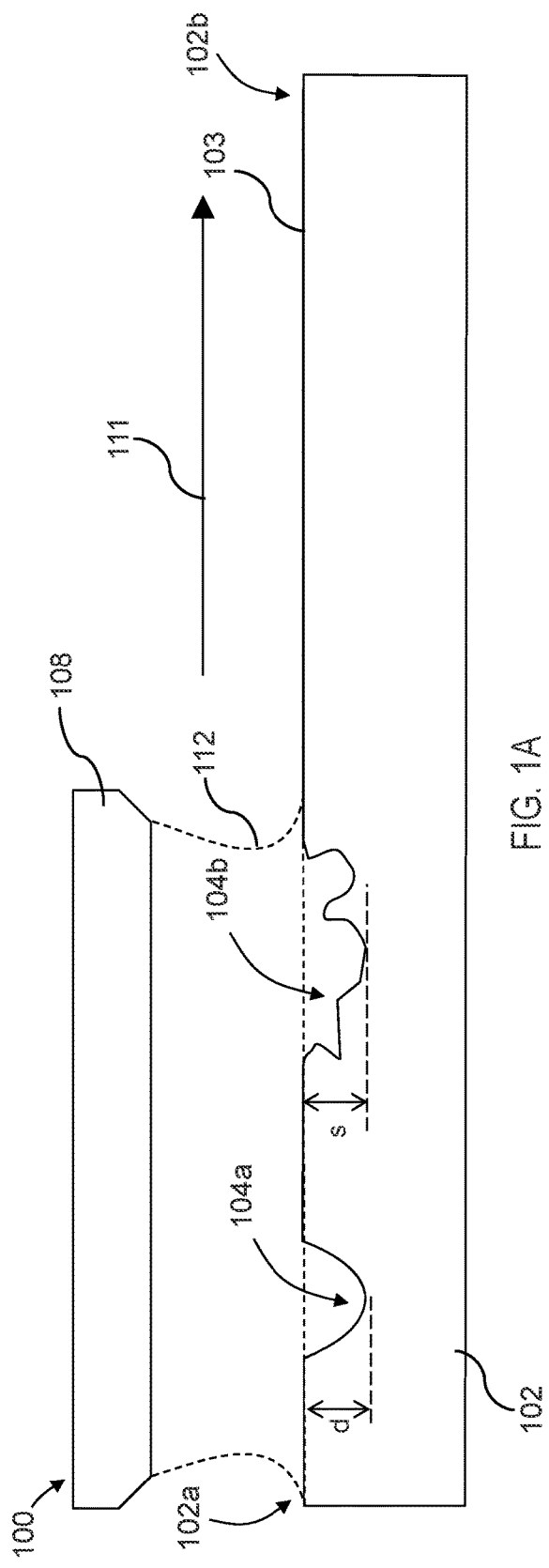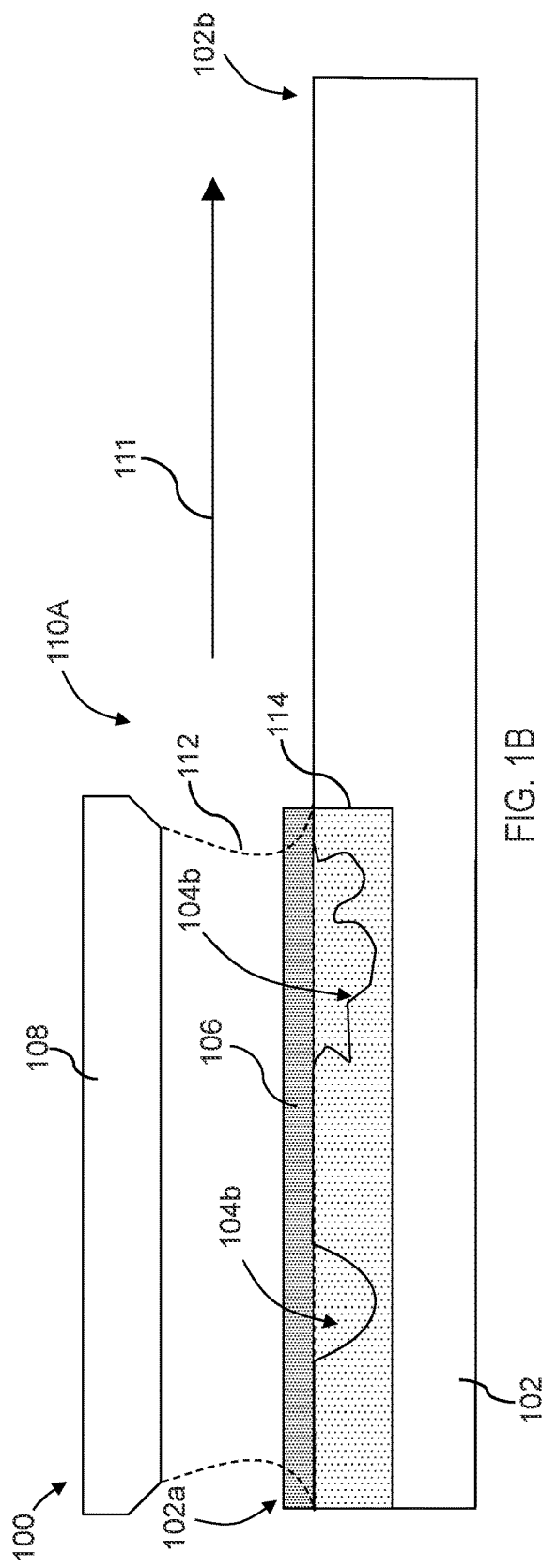

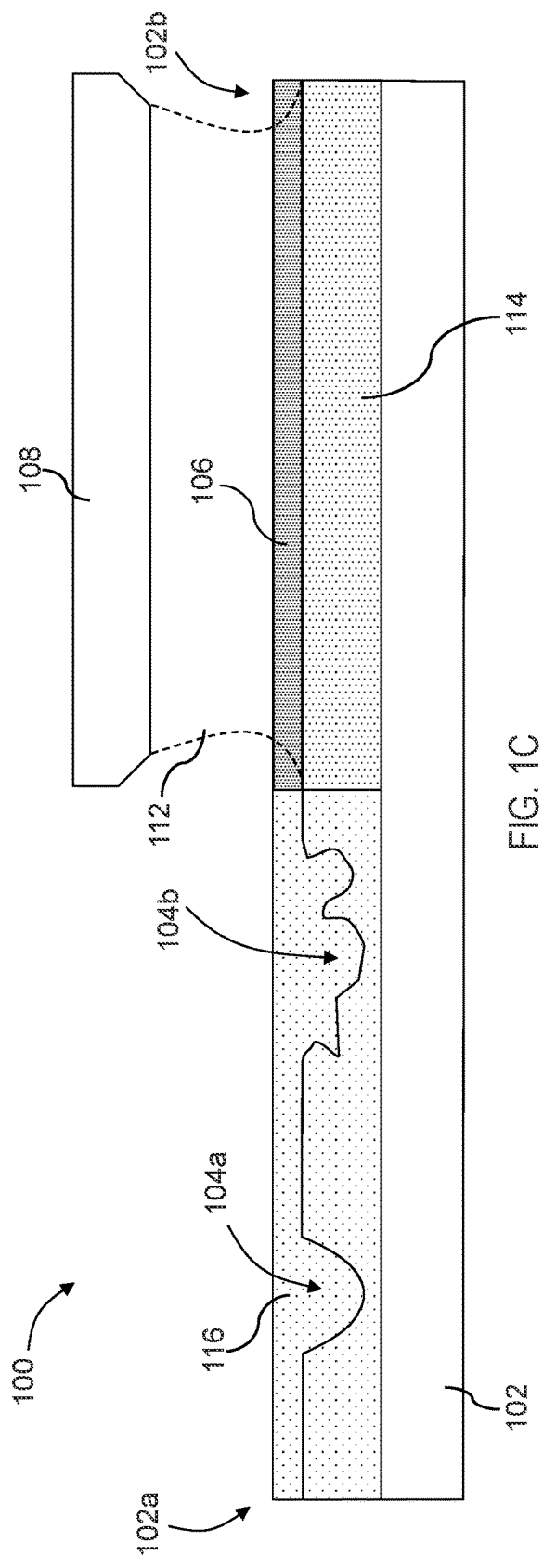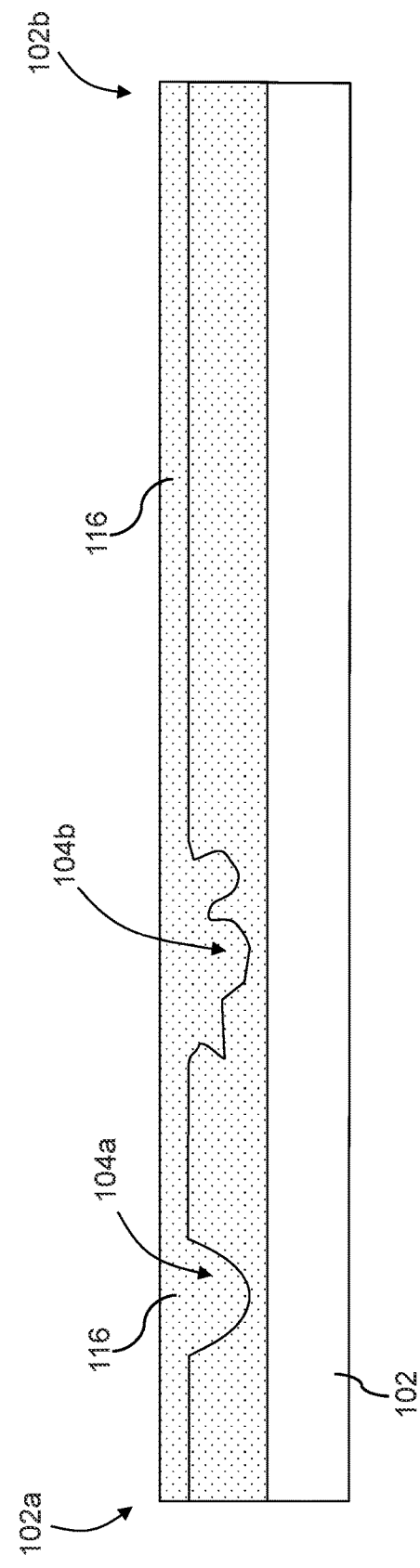

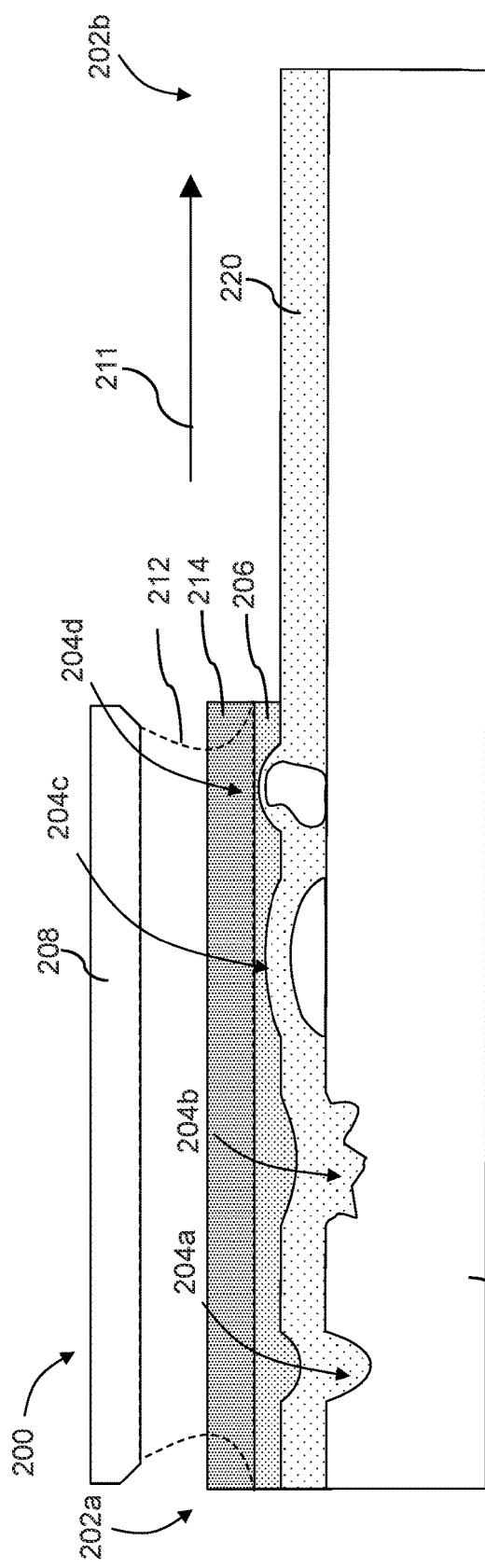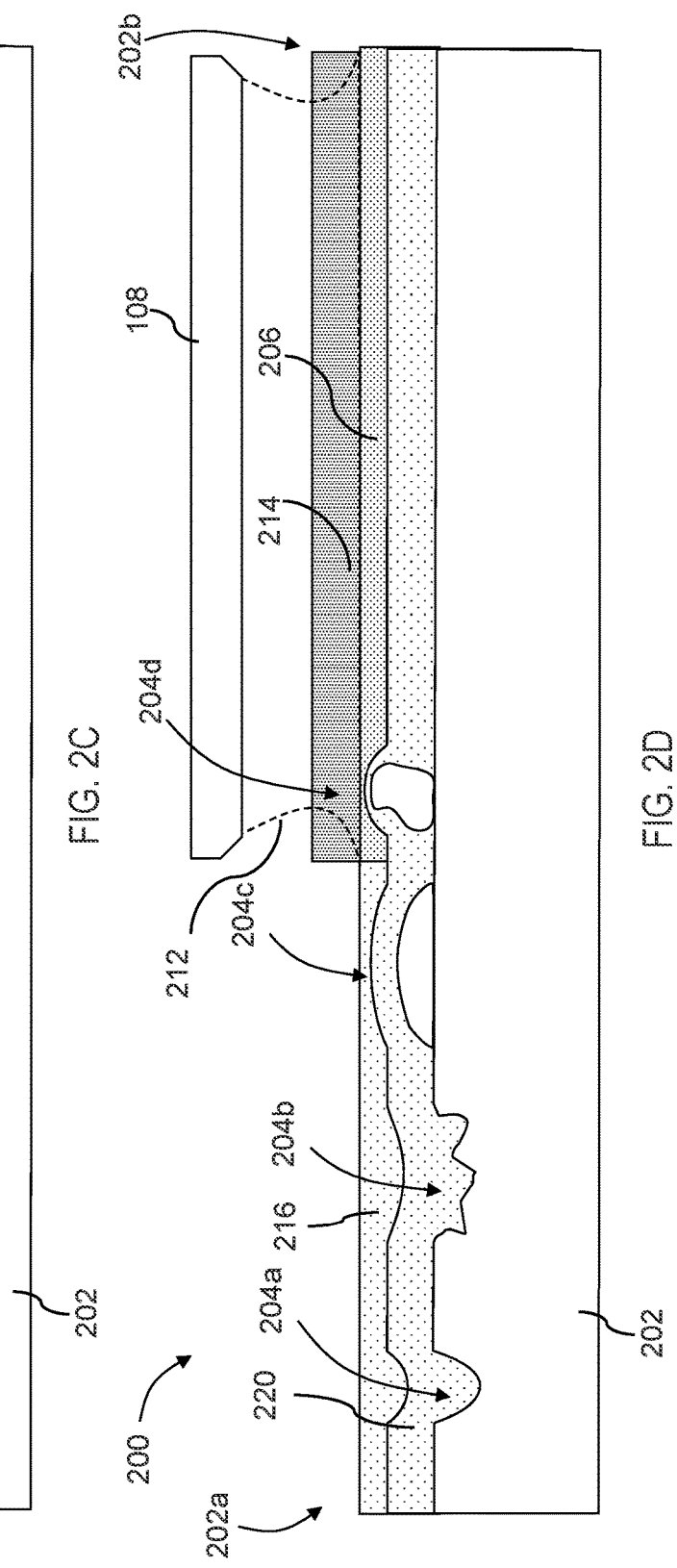

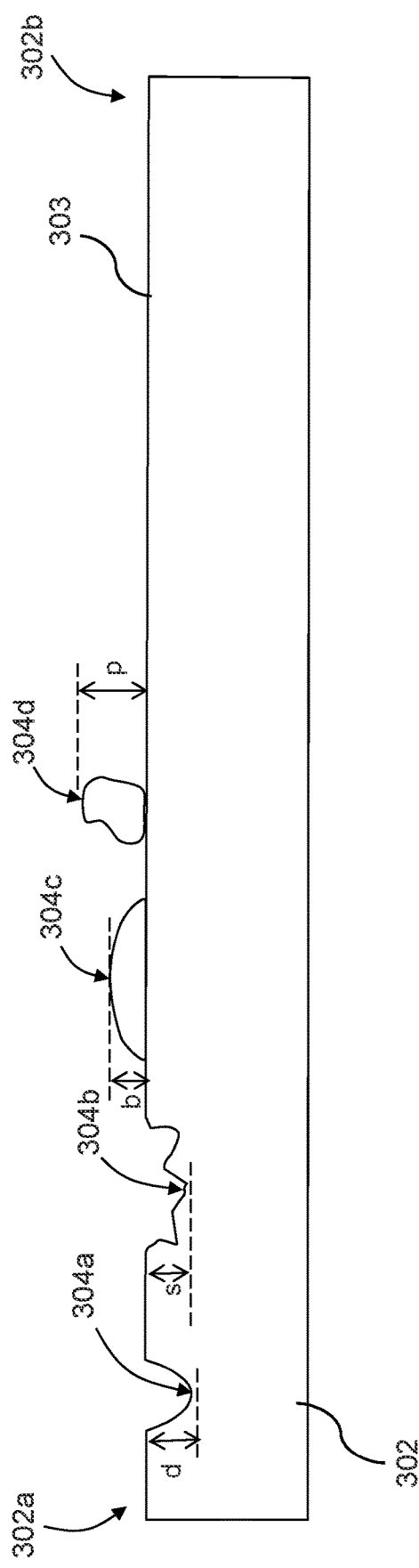
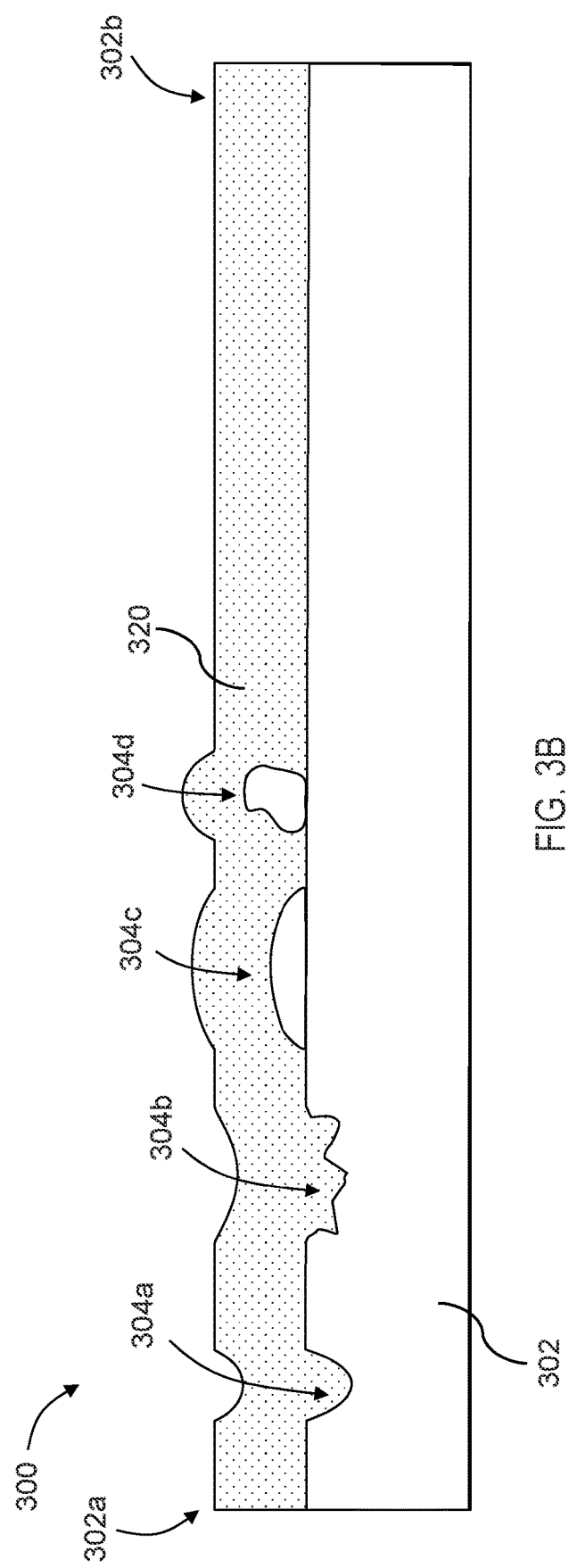
FIG. 3A
FIG. 3B

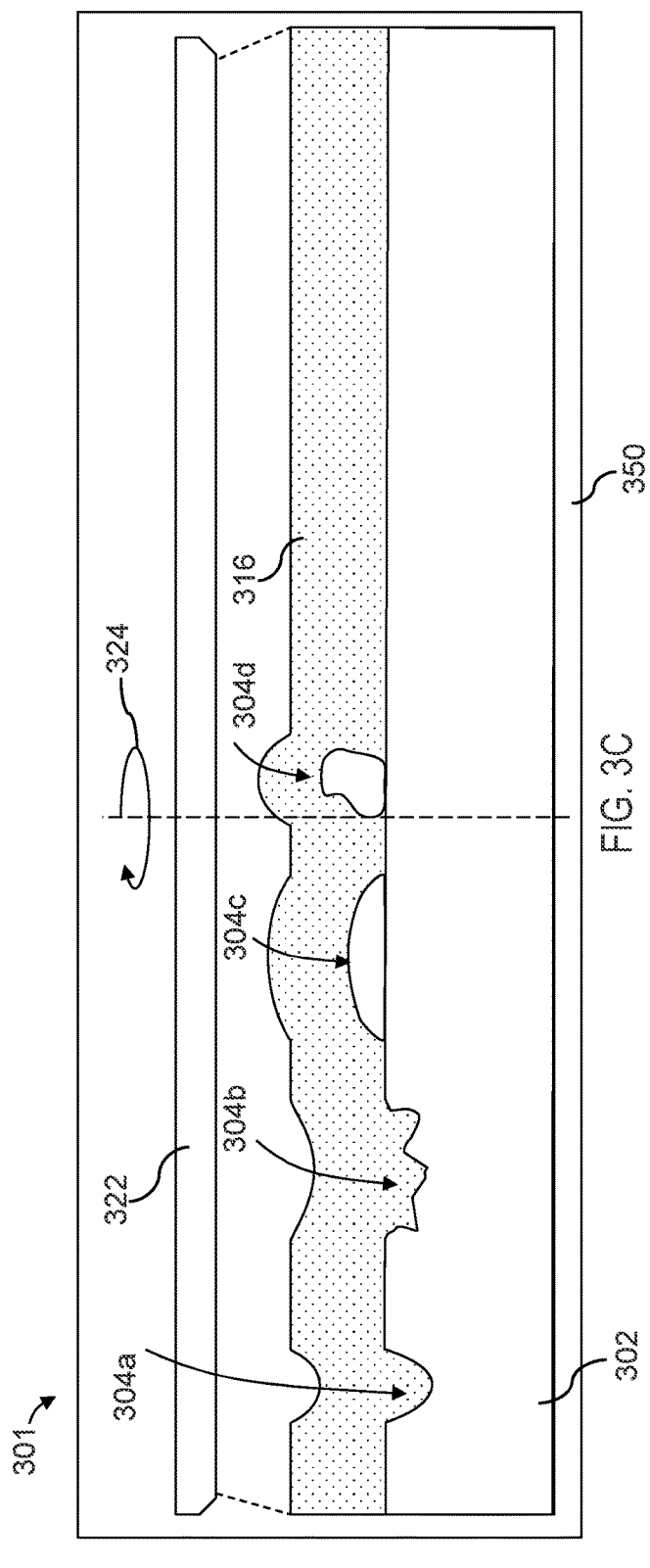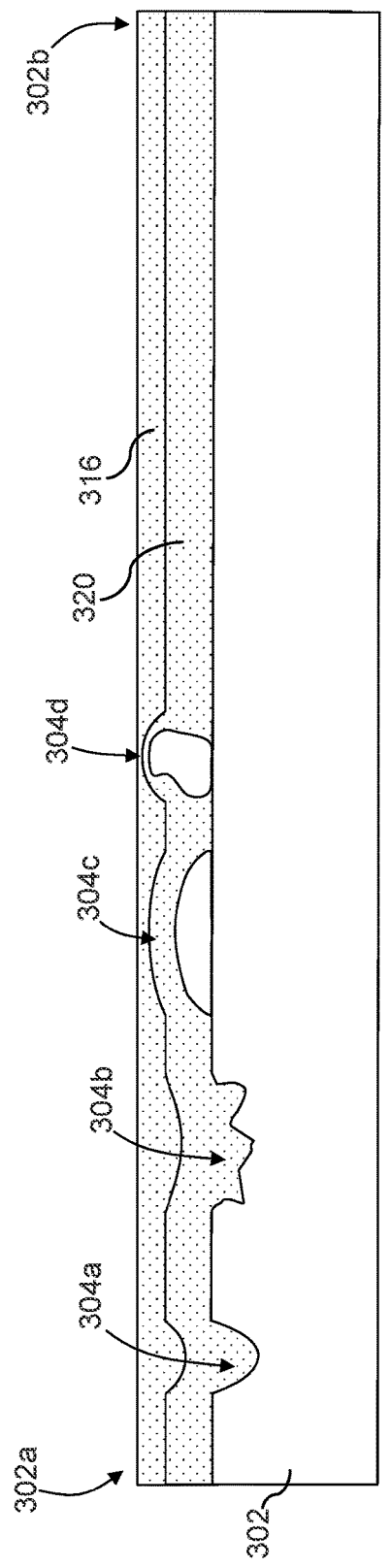

EXTREME ULTRAVIOLET MASK BLANK DEFECT REDUCTION

CROSS-REFERENCE TO RELATED APPLICATIONS

This application claims priority to India Application No. 202041017464, filed Apr. 23, 2020, the entire disclosure of which is hereby incorporated by reference herein.

TECHNICAL FIELD

The present disclosure relates generally to extreme ultraviolet lithography, and more particularly methods for reducing defects in the manufacture of extreme ultraviolet mask blanks.

BACKGROUND

Extreme ultraviolet (EUV) lithography, also known as soft x-ray projection lithography, can be used for the manufacture of 0.0135 micron and smaller minimum feature size semiconductor devices. Extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate.

The lens elements and mask blanks of extreme ultraviolet lithography systems are coated with reflective multilayer coatings of materials such as molybdenum and silicon on a substrate having very low thermal expansion, for example, ultra low thermal expansion glass (e.g., ULE® glass available from Corning, Inc. or Zerodur® low expansion lithium aluminosilicate glass). Reflection values of approximately 65% per lens element, or mask blank, have been obtained by using substrates that are coated with multilayer coatings that strongly reflect light within an extremely narrow ultraviolet bandpass, for example, 12.5 to 14.5 nanometer bandpass for 13.5 nanometer ultraviolet light.

EUV mask blanks have a low tolerance for defects on the working area of the mask blank. A flat, smooth and defect-free surface of the substrate ultra low thermal expansion glass) is needed for fabrication of defect-free extreme ultraviolet mask blanks. Current substrate treatment processes for EUV mask blank substrates involves a polishing process by chemical mechanical planarization (CMP) and a cleaning process, however, these processes tend to generate defects such pits, scratches, bumps and particles on the surface of substrate. Accordingly, further improvements are needed to provide a defect-free surface without pits, scratches, bumps and particles depositing EUV reflective multilayers.

SUMMARY

One or more embodiments of the disclosure are directed to a method of manufacturing an extreme ultraviolet (EUV) mask blank. In an embodiment, a method comprises scanning a surface of a glass substrate comprising pits and scratches with a laser, the glass substrate having a softening point temperature; melting the surface to form a molten mass to fill the pits and scratches; cooling the molten mass and forming a cooled, smooth surface.

Additional embodiments of the disclosure are related to a method of manufacturing an extreme ultraviolet (EUV) mask blank. The process comprises forming depositing a metal smoothing layer on a surface of a glass substrate comprising pits and scratches, the glass substrate having a softening point temperature; melting the metal smoothing layer to form a molten mass; filling the pits and scratches with the molten mass; and cooling the substrate to form a cooled, smooth surface.

Further embodiments of the disclosure are directed to an extreme ultraviolet (EUV) mask blank extreme ultraviolet mask blank comprising a glass substrate comprising pits, scratches, bumps and particles on a surface of the glass substrate; a metal smoothing layer covering the pits, scratches, bumps and particles, wherein the metal smoothing layer comprises a metal having a melting point that is of from 200 to 400° C. lower than the softening point temperature of the substrate; and a multilayer stack reflective of EUV radiation on the metal smoothing layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1A schematically illustrates a laser positioned over an EUV mask blank substrate;

FIG. 1B schematically illustrates a radiation beam from the laser melting a surface of the EUV mask blank substrate and filling of a pit and a scratch on a first end of the EUV mask blank substrate;

FIG. 1C schematically illustrates the laser directing a radiation beam radiation towards a second end of the EUV mask blank substrate;

FIG. 1D illustrates a smoothed EUV mask blank substrate after processing with a beam of radiation from a laser;

FIG. 2C schematically illustrates a radiation beam from the laser melting the metal layer on the EUV mask blank substrate and filling of a pit and a scratch on a first end of the EUV mask blank substrate;

FIG. 2D schematically illustrates the laser directing a radiation beam radiation towards a second end of the EUV mask blank substrate;

FIG. 3A illustrates an EUV mask blank substrate comprising a pit, a scratch, a particle and a bump;

FIG. 3B schematically illustrates a metal layer formed over the pit, the scratch, the particle and the bump on the EUV mask blank substrate;

FIG. 3C schematically illustrates heating apparatus melting the metal layer on the EUV mask blank substrate and filling of a pit and a scratch on a first end of the EUV mask blank substrate;

FIG. 3D illustrates a smoothed EUV mask blank substrate after processing with heating apparatus.

DETAILED DESCRIPTION

Figure 2A:
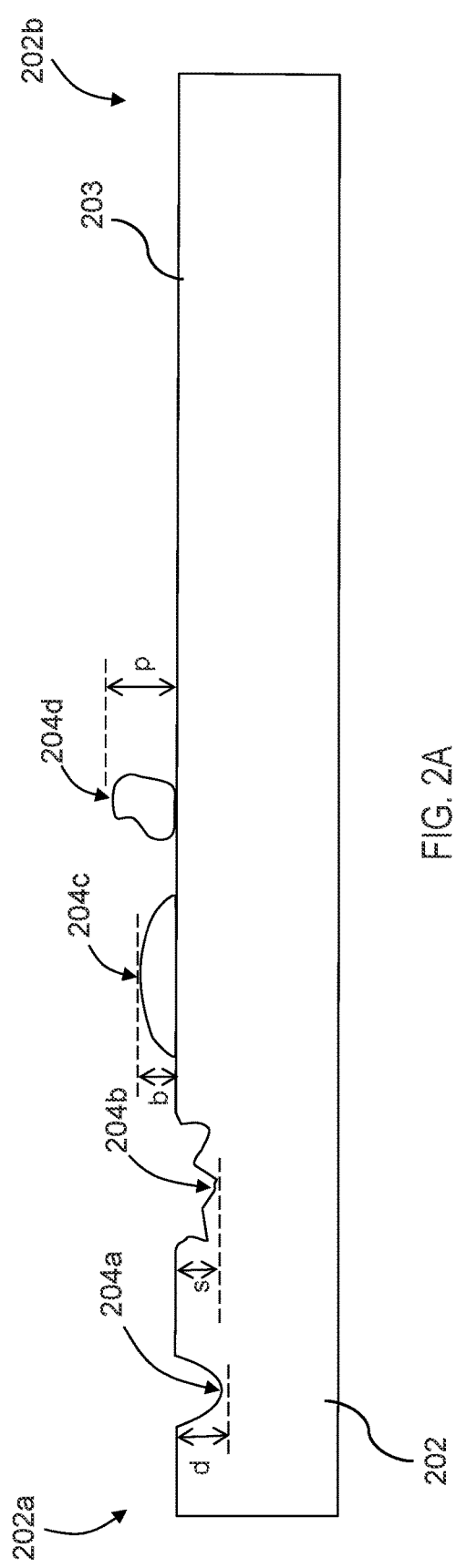
FIG. 2A schematically illustrates a laser positioned over an EUV mask blank substrate comprising a pit, a scratch, a particle and a bump.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that reacts with the substrate surface.

Those skilled in the art will understand that the use of ordinals such as "first" and "second" to describe process regions do not imply a specific location within the processing chamber, or order of exposure within the processing chamber.

As used in this specification and the appended claims, the term "substrate" refers to a surface, or portion of a surface, upon which a process acts. It will also be understood by those skilled in the art that reference to a substrate is to only a portion of the substrate, unless the context clearly indicates otherwise. Additionally, in some embodiments, reference to depositing on a substrate means both a bare substrate and a substrate with one or more films or features deposited or formed thereon.

Referring now to FIGS. 1A and 1B, according to one or more embodiments of the disclosure, a schematic of a surface re-melting process 100 is shown. In an embodiment of a process 100, a laser 108 is utilized to heat a surface 103 of a substrate 102. The laser 108 emits a radiation beam 112 directed at a substrate including one or more pits 104a having a depth d and one or more scratches 104b having a depth s. The substrate 102, which in some embodiments comprises an ultra low expansion glass such as a titanium-containing silica glass, is melted at the substrate surface 103. The laser 108 is positioned above the substrate 102 as shown in FIG. 1A, and laser 108 is moved in the direction of arrow 111. In other embodiments, the laser 108 remains stationary, and the substrate 102 can be moved with respect to the laser 108. In other embodiments, both the laser 108 and the substrate 102 can be moved with respect to each other. In some embodiments, a plurality of lasers 108 can be utilized in the surface re-melting process 100. For example, in some embodiments, a linear array of lasers 108 is used in the surface re-melting process 100. The radiation beam 112 emitted by the laser 108 in the embodiment shown is moved so that the substrate surface 103 is contacted from a first end 102a to a second end 102b of the substrate. Thus, the laser 208 rasters the surface 103 of the substrate 102 from the first end 102a to the second end 102b.

According to one or more embodiments, the radiation beam 112 heats and melts the substrate surface 103 as shown in FIG. 1B to form a molten mass 106, which in some embodiments is a molten glass mass, to form a smooth, molten surface 114, which in some embodiments is a molten surface 114. The molten surface 114 fills the pit 104a and the scratch 104b. The smooth, molten surface 114 is flat and smooth due to minimization of surface energy. As the laser 108 is moved away from the first end 102a of the substrate 102 towards the second end 102b, a cooled, smooth surface 116 is formed over the pit 104a and the scratch 104b. As the laser 108 toward the second end 102b of the substrate 102, a molten mass 106 is formed, which upon cooling forms a smooth, molten surface 114 as shown in FIG. 1C. In FIG. 1D, a final substrate ready for deposition of a multilayer stack is shown as including a cooled, smooth surface 116 extending from the first end 102a to the second end 102b of the substrate 102. As a result of the re-melting process 100, the pit 102a and the scratch 102b is filled and removed so that the surface of the substrate has an average roughness (Ra) of less than 0.15 nm.

According to one or more embodiments of the disclosure, a variety of types of laser types can utilized in the surface re-melting process. In some embodiments, a laser power of greater than 5 W is used. The size of the laser beam is at least greater than 10 μm with a scanning pitch in the range of 10-200 μm and a scanning speed of 10-200 mm/s.

In an exemplary embodiment of the disclosure, the laser includes a carbon dioxide laser operating in a wavelength range of 9-12 μm. In a specific embodiment of the disclosure, the specific wavelength band of the carbon dioxide laser is centered at 9.4 μm and 10.6 μm.

In another embodiment of the disclosure, the laser comprises a carbon monoxide laser operating at a wavelength ranges from 2.6-4 μm, or from 4.8-8.3 μm. In another embodiment of the disclosure, the laser comprises a helium-neon laser operating at a wavelength band of 632.8 nm. Additionally, the helium-neon laser can also operate at a wavelength band of 543.5 nm, 593.9 nm, 611.8 nm, 1.1523 μm, 1.52 μm, and 3.3913 μm.

In another embodiment of the disclosure, the laser comprises an argon laser operating at any of multiple wavelength bands including, 454.6 nm, 488.0 nm, 514.5 nm (351 nm, 363.8, 457.9 nm, 465.8 nm, 476.5 nm, 472.7 nm, 528.7 nm, and frequency doubled to provide 244 nm, 257 nm).

In another embodiment of the disclosure, the laser comprises a krypton laser operating at multiple wavelength bands including: 416 nm, 530.9 nm, 568.2 nm, 647.1 nm, 676.4 nm, 752.5 nm, 799.3 nm.

In another embodiment of the disclosure, the laser comprises a nitrogen laser operating at a wavelength band of 337.1 nm.

In another embodiment of the disclosure, the laser comprises an excimer laser. In a specific embodiment of the disclosure, the excimer laser comprises an argon-fluoride laser operating at a wavelength band of 193 nm. In specific embodiments, the excimer laser comprises a krypton-fluoride laser operating at a wavelength of 248 nm. In another embodiment of the disclosure, the excimer laser comprises a xenon-chloride laser with a wavelength band of 308 nm or a xenon-fluoride laser at a wavelength band of 353 nm.

In another embodiment of the disclosure, the laser comprises a xenon ion laser. The xenon ion laser of one or more embodiments operates at any operating wavelength throughout the visible spectrum extending into the ultraviolet band and infrared band.

In another embodiment of the disclosure, the laser comprises a broadband white light laser. The broadband white light laser of some embodiments performs under any operating wavelength throughout the visible spectrum extending into the ultraviolet band and infrared band.

The process shown in FIGS. 1A-D was used on an ultra low expansion glass substrate having a scratch with a depth of 7 nm. A laser was rastered over the substrate, and the depth of the scratch was reduced to 1.5 nm. According to one or more embodiments, the substrate has an average roughness Ra of less than 0.15 nm and 0.10 nm after the re-melting process. A substrate scanned three times has an average roughness Ra of less than 0.09 nm, less than 0.08 nm and less than 0.07 nm.

Referring now to FIGS. 2A-2E, according to one or more embodiments of the disclosure, a schematic of a metal smoothing and melting process 200 is shown. In an embodiment of the metal smoothing and melting process 200, a laser 208 is utilized to heat a metal smoothing layer 220 deposited on a surface 203 of a substrate 202. The substrate 202 including one or more pits 204a having a depth d and one or more scratches 204b having a depth s. The one or more pits 204a and one or more scratches 204b are concave defects. The substrate 202 also includes one or more bumps 204c or surface imperfections and one or more particles 204d. The one or more bumps 204c have a height b and the one or more particles have a height p, and the height b and height h are the distance that the bump or particle extend from the surface 203 of the substrate 202. The bump 204c and the particle 204d are convex defects.

Figure 2B:
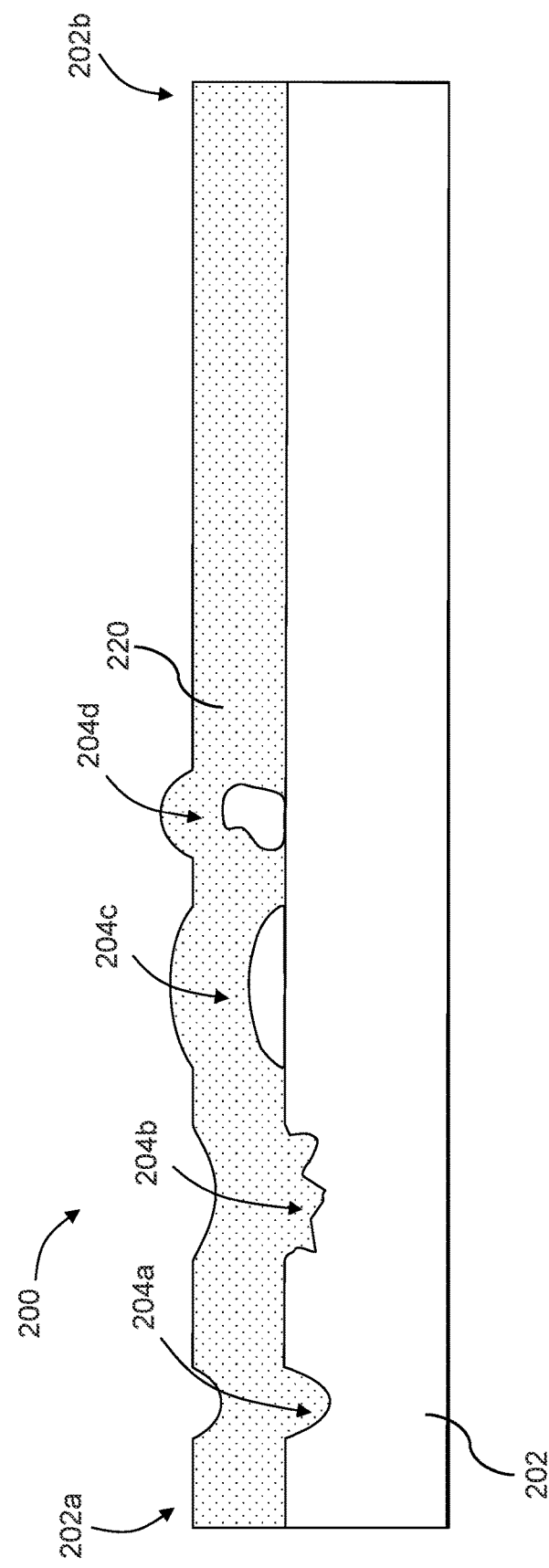
FIG. 2B schematically illustrates a metal layer formed over the pit, the scratch, the particle and the bump on the EUV mask blank substrate.

The substrate 202, which in some embodiments comprises an ultra low expansion glass such as a titanium-containing silica glass, is covered with a metal smoothing layer 220 as shown in FIG. 2B. The metal smoothing layer 220 fills the concave defects, namely the one or more pits 204a and the one or more scratches 204b to partially smooth these defects. In addition, the metal smoothing layer 220 covers the one or more bumps 204c and the one or more particles 204d to partially smooth these defects.

The melting point of the metal smoothing layer 220 deposited on the substrate 202 will be in the range of from 200 to 400° C. lower than the softening point temperature of the substrate 202. In some embodiments, the substrate 202 is an ultra low expansion glass having a softening point temperature of about 1490° C. According, in some embodiments, the melting point of the metal smoothing layer is in a range of from 400 to 1100° C. The thickness of the metal smoothing layer may vary in a range of from 2 nm to 50 nm.

The metal smoothing layer 220 according to one or more embodiments comprises a low melting point metal. In one or more embodiments of the disclosure, the metal smoothing layer is selected from the group consisting of zinc, aluminum, brass, magnesium, silver, copper and alloys thereof. The metal smoothing layer 220 is deposited according to one or more embodiment using physical vapor deposition, chemical vapor deposition or atomic layer deposition.

Referring now to FIG. 2B, the metal smoothing layer is deposited on the substrate surface 203, filling in any subsurface imperfections such as pits 204a and scratches 204b and covering bumps 204c or particles 204d on the substrate surface 203. In one or more embodiments of the disclosure, the metal smoothing layer 220 is deposited onto the substrate surface 203 in a liquid state. In another embodiment of the disclosure, the metal smoothing layer 220 is deposited onto the substrate surface 203 in a solid state.

Referring now to FIG. 2C, a laser 208 emits a radiation beam 212 directed the metal smoothing layer 220 on the substrate surface 203. The laser 208 is positioned above the substrate 202 as shown in FIG. 2C, and laser 208 is moved in the direction of arrow 211. In other embodiments, the laser 208 remains stationary, and the substrate 202 can be moved with respect to the laser 208. In other embodiments, both the laser 208 and the substrate 202 can be moved with respect to each other. In some embodiments, a plurality of lasers 208 can be utilized in the process 200. For example, in some embodiments, a linear array of lasers 208 is used in the process 200. The radiation beam 212 emitted by the laser 208 in the embodiment shown is moved so that the metal smoothing layer 220 is contacted from a first end 202a to a second end 202b of the substrate 202. Thus, the laser 208 rasters the metal smoothing layer 220 covering the surface 203 of the substrate 202 from the first end 202a to the second end 202b.

Figure 2E:
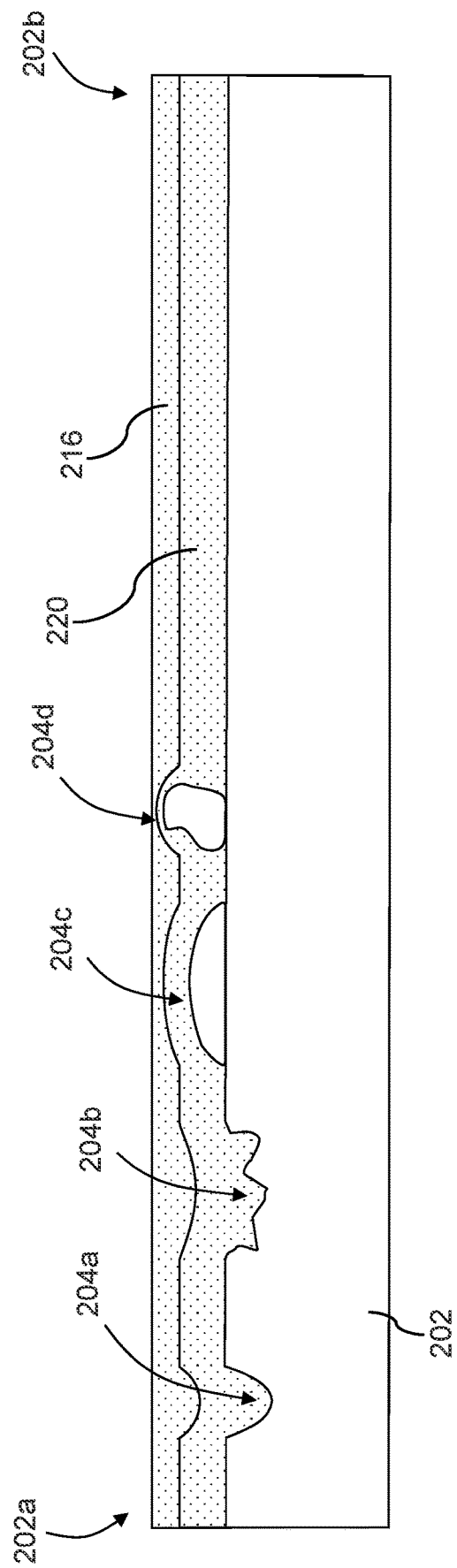
FIG. 2E illustrates a smoothed EUV mask blank substrate after processing with a beam of radiation from a laser.

According to one or more embodiments, the radiation beam 212 heats and melts the metal smoothing layer 220 as shown in FIG. 2C to form a molten metal 206 to form a smooth, molten metal surface 214, which fills the pit 204a and the scratch 204b. The smooth, molten metal surface 214 is flat and smooth due to minimization of surface energy. As the laser 208 is moved away from the first end 202a of the substrate 202 towards the second end 202b, a cooled, smooth surface 216 is formed over the pit 204a and the scratch 204b. As the laser 208 toward the second end 202b of the substrate 202, a molten metal 206 mass is formed over the bump 204c and the particle 204d, which upon cooling forms a smooth, molten metal surface 214 as shown in FIG. 2D. In FIG. 2E, a final substrate 202 ready for deposition of a multilayer stack is shown as including a cooled, smooth surface 216 extending from the first end 202a to the second end 202b of the substrate 202. As a result of the metal smoothing layer and melting process 200, the pit 204a and the scratch 204b are filled, and the bump 202c and the particle 202d are smoothed over so that the surface of the substrate has an average roughness (Ra) of less than 0.15 nm. According to one or more embodiments, the substrate has an average roughness Ra of less than 0.15 nm and 0.10 nm after the metal layer smoothing and melting process 200. A substrate scanned three times has an average roughness Ra of less than 0.09 nm, less than 0.08 nm and less than 0.07 nm.

Referring now to FIGS. 3A-D, an embodiment of a metal smoothing layer and thermal melting process 300 is shown. In an embodiment of the metal smoothing and thermal melting process 300, a heating apparatus 350 is utilized to heat a metal smoothing layer 320 deposited on a surface 303 of a substrate 302. The substrate 302 includes one or more pits 304a having a depth d and one or more scratches 304b having a depth s. The one or more pits 304a and one or more scratches 304b are concave defects. The substrate 302 also includes one or more bumps 304c or surface imperfections and one or more particles 304d. The one or more bumps 304c have a height b and the one or more particles have a height p, and the height b and height h are the distance that the bump or particle extend from the surface 303 of the substrate 302. The bump 304c and the particle 304d are convex defects.

The substrate 302, which in some embodiments comprises an ultra low expansion glass such as a titanium-containing silica glass, is covered with a metal smoothing layer 320 as shown in FIG. 3B. The metal smoothing layer 320 fills the concave defects, namely the one or more pits 304a and the one or more scratches 304b to partially smooth these defects. In addition, the metal smoothing layer 320 covers the one or more bumps 304c and the one or more particles 304d to partially smooth these defects.

The melting point of the metal smoothing layer 320 deposited on the substrate 202 will be in the range of from 200 to 400° C. lower than the softening point temperature of the substrate 302. In some embodiments, the substrate 302 is an ultra low expansion glass having a softening point of about 1490° C. According, in some embodiments, the melting point of the metal smoothing layer is in a range of from 400 to 1100° C. The thickness of the metal smoothing layer may vary in a range of from 2 nm to 50 nm.

The metal smoothing layer 320 according to one or more embodiments comprises a low melting point metal. In one or more embodiments of the disclosure, the metal smoothing layer is selected from the group consisting of zinc, aluminum, brass, magnesium, silver, copper and alloys thereof. The metal smoothing layer 320 is deposited according to one or more embodiment using physical vapor deposition, chemical vapor deposition or atomic layer deposition.

Referring now to FIG. 3B, the metal smoothing layer 320 is deposited on the substrate surface 303, filling in any subsurface imperfections such as pits 304a and scratches 304b and covering bumps 304c or particles 304d on the substrate surface 303. In one or more embodiments of the disclosure, the metal smoothing layer 320 is deposited onto the substrate surface 303 in a liquid state. In another embodiment of the disclosure, the metal smoothing layer 320 is deposited onto the substrate surface 303 in a solid state.

Referring now to FIG. 3C, a heating apparatus 350, for example, a rapid thermal processing chamber, heats and melts the metal smoothing layer 320 as shown in FIG. 3C to form a smooth molten metal 316 to form a smooth, molten metal surface, which fills the pit 304a and the scratch 304b. The smooth, molten metal surface 316 is flat and smooth due to minimization of surface energy. The smooth molten metal 316 is also formed over the bump 304c and the particle 304d, which upon cooling forms a smooth, molten metal surface 316 as shown in FIG. 3D. As a result of the metal smoothing layer and thermal melting process 300, the pit 304a on a first end 302a of the substrate 302 and the scratch 302b are filled, and the bump 304c and the particle 304d closer to the second end 302b of the substrate 302 are smoothed over so that the surface of the substrate has an average roughness (Ra) of less than 0.15 nm. According to one or more embodiments, the substrate has an average roughness Ra of less than 0.15 nm and 0.10 nm after the metal layer smoothing and thermal melting process 300. In some embodiments, the substrate 302 has an average roughness Ra of less than 0.09 nm, less than 0.08 nm and less than 0.07 nm.

The metal smoothing layer and thermal melting process 300 of one or more embodiments is performed in heating apparatus 350 comprising a rapid thermal processing chamber 301 including heating lamps 322. In some embodiments, the surface of metal smoothing layer 320 is heated up to a temperature of from 400° C. to 100° C. with a heating ramp rate greater than about 100° C./second. In some embodiments, the substrate 302 is rotated at a speed of ranging from 20 to about 200 rotations per minute in the direction of arrow 324. The substrate 302 can be processed in the rapid thermal processing chamber for times ranging from 5 seconds to 10 minutes. After a defect-free smooth surface of the metal assisting layer is formed, covering all defects of pit, scratch, bump and particles, for further deposition of EUV mask blank multilayers.

Figure 4:
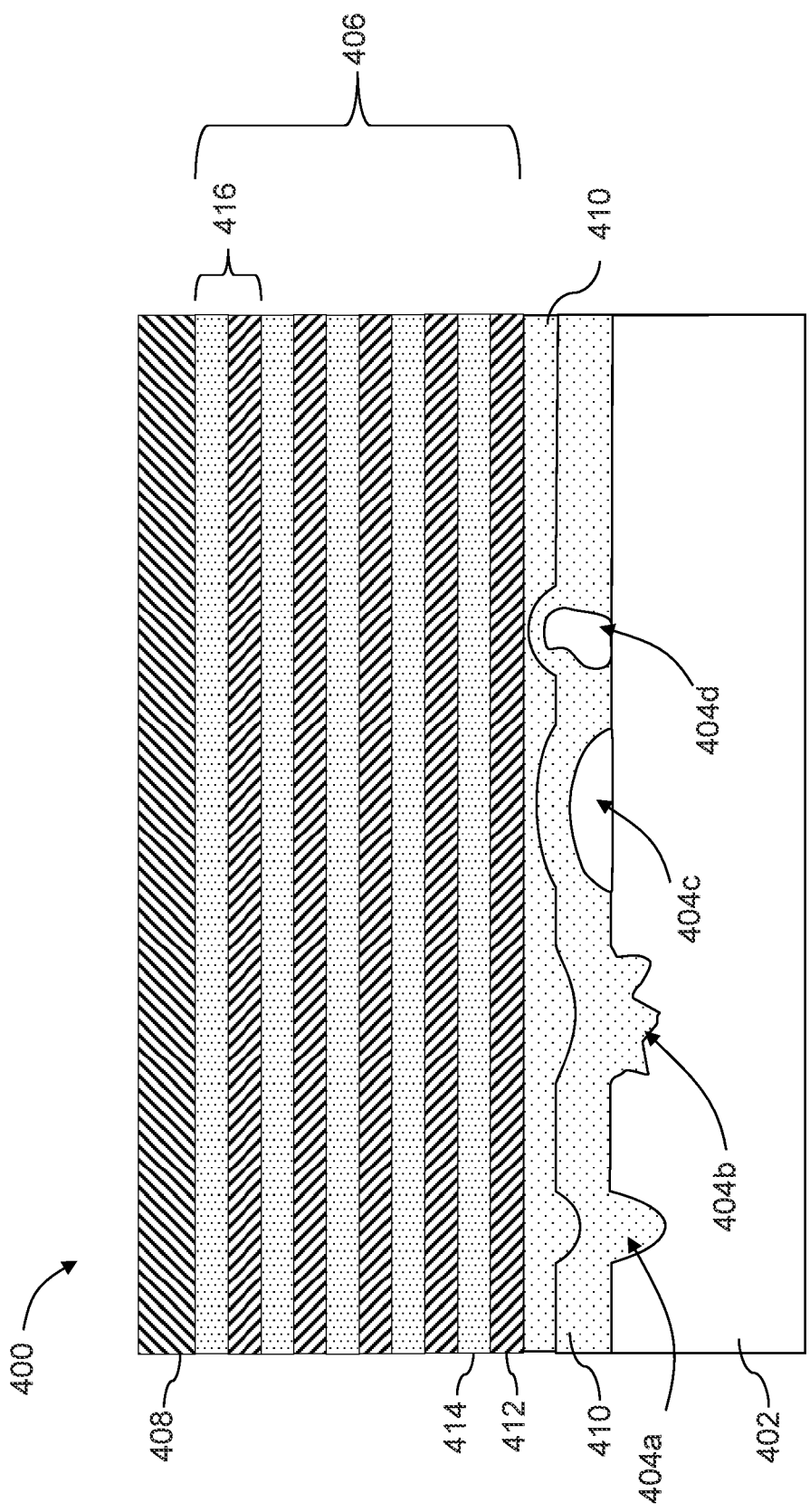
FIG. 4 illustrates an embodiment of an extreme ultraviolet reflective element such as an EUV mask blank.

Referring now to FIG. 4, an embodiment of an extreme ultraviolet reflective element 400 is shown. In one or more embodiments, the extreme ultraviolet reflective element 400 is an EUV mask blank used to make an extreme ultraviolet mirror. EUV mask blanks and extreme ultraviolet mirrors are structures for reflecting extreme ultraviolet light.

The extreme ultraviolet reflective element 400 includes a substrate 402, a multilayer stack 406 of reflective layers, and a capping layer 408. The extreme ultraviolet reflective element 400, which in some embodiments is an EUV mask blank, includes the substrate 402, the multilayer stack 406 of reflective layers comprising alternating layers of silicon and molybdenum, and an optional capping layer 408. The extreme ultraviolet reflective element 400 in some embodiments is an EUV mask blank, which is used to form a reflective mask by patterning, which is used in an EUV lithography system. In the following sections, the term for the EUV mask blank is used interchangeably with the term of the extreme ultraviolet mirror for simplicity.

The EUV mask blank is an optically flat structure used for forming a reflective mask having a mask pattern. In one or more embodiments, the reflective surface of the EUV mask blank forms a flat focal plane for reflecting the incident light.

The substrate 402 is an element for providing structural support to the extreme ultraviolet reflective element 400. In one or more embodiments, the substrate 402 is made from a material having a low coefficient of thermal expansion (CTE) to provide stability during temperature changes. In one or more embodiments, the substrate 402 has properties such as stability against mechanical cycling, thermal cycling, crystal formation, or a combination thereof. The substrate 402 according to one or more embodiments is formed from a material such as silicon, glass, oxides, ceramics, glass ceramics, or a combination thereof. In some embodiments, the substrate 402 comprises a glass comprising silicon dioxide and titania. In specific embodiments, the substrate comprises an ultra low expansion titania silicate glass, for example, ULE® glass available from Corning, Inc. or Zerodur® low expansion lithium aluminosilicate glass. In some embodiments, an ultra low expansion glass has a mean coefficient of thermal expansion (CTE) of 0+/−30 ppb from 5° C. to 35° C.

The substrate 402 comprises surface defects including one or more pits 404a, scratches 404b, bumps 404c and particles 404d. The substrate further comprises a smoothing layer 410 comprised of either the same material as the substrate or a metal smoothing layer. The smoothing layer 410 may further comprise a surface layer 410a.

As a result of the smoothing layer 410 and the surface layer 410a the pit 402a and the scratch 402b are filled, and the bump 402c and the particle 402d are smoothed over so that the surface of the substrate 402 has an average roughness (Ra) of less than 0.15 nm. According to one or more embodiments, the substrate has a surface having an average roughness Ra of less than 0.15 nm and 0.10 nm. In some embodiments, the substrate 402 has an average roughness Ra of less than 0.09 nm, less than 0.08 nm and less than 0.07 nm.

In embodiments in which the smoothing layer 410 and surface layer 410a comprise metal, the metal is selected from the group consisting of zinc, aluminum, brass, magnesium, silver, copper and alloys thereof.

The multilayer stack 406 is a structure that is reflective to the extreme ultraviolet light. The multilayer stack 406 includes alternating reflective layers of a first reflective layer 412 and a second reflective layer 414.

The first reflective layer 412 and the second reflective layer 414 form a reflective pair 416 of FIG. 4. In a non-limiting embodiment, the multilayer stack 406 includes a range of 20-60 of the reflective pairs 416 for a total of up to 120 reflective layers.

The first reflective layer 412 and the second reflective layer 414 according to one or more embodiments are formed from a variety of materials. In an embodiment, the first reflective layer 412 and the second reflective layer 414 are formed from silicon and molybdenum, respectively.

The first reflective layer 412 and the second reflective layer 414 of some embodiments have a variety of structures. In an embodiment, both the first reflective layer 412 and the second reflective layer 414 are formed with a single layer, multiple layers, a divided layer structure, non-uniform structures, or a combination thereof. Because most materials absorb light at extreme ultraviolet wavelengths, the optical elements used are reflective instead of the transmissive, as used in other lithography systems. The multilayer stack 406 forms a reflective structure by having alternating thin layers of materials with different optical properties to create a Bragg reflector or mirror.

In an embodiment, each of the alternating layers has dissimilar optical constants for the extreme ultraviolet light. The alternating layers provide a resonant reflectivity when the period of the thickness of the alternating layers is one half the wavelength of the extreme ultraviolet light. In an embodiment, for the extreme ultraviolet light at a wavelength of 13 nm, the alternating layers are about 6.5 nm thick. It is understood that the sizes and dimensions provided are within normal engineering tolerances for typical elements.

The multilayer stack 406 according to one or more embodiments is formed in a variety of ways. In an embodiment, the first reflective layer 412 and the second reflective layer 414 are formed with magnetron sputtering, ion sputtering systems, pulsed laser deposition, cathode arc deposition, or a combination thereof.

In an illustrative embodiment, the multilayer stack 406 is formed using a physical vapor deposition technique, such as magnetron sputtering. In an embodiment, the first reflective layer 412 and the second reflective layer 414 of the multilayer stack 406 have the characteristics of being formed by the magnetron sputtering technique including precise thickness, low roughness, and clean interfaces between the layers. In an embodiment, the first reflective layer 412 and the second reflective layer 414 of the multilayer stack 406 have the characteristics of being formed by the physical vapor deposition including precise thickness, low roughness, and clean interfaces between the layers.

The physical dimensions of the layers of the multilayer stack 406 formed using the physical vapor deposition technique is precisely controlled to increase reflectivity. In an embodiment, the first reflective layer 412, such as a layer of silicon, has a thickness of 4.1 nm. The second reflective layer 414, such as a layer of molybdenum, has a thickness of 2.8 nm. The thickness of the layers dictates the peak reflectivity wavelength of the extreme ultraviolet reflective element. If the thickness of the layers is incorrect, the reflectivity at the desired wavelength 13.5 nm of some embodiments reduced.

In one or more embodiments, the capping layer 408 is a protective layer allowing the transmission of the extreme ultraviolet light. In an embodiment, the capping layer 408 is formed directly on the multilayer stack 406. In one or more embodiments, the capping layer 408 protects the multilayer stack 406 from contaminants and mechanical damage. In one embodiment, the multilayer stack 406 is sensitive to contamination by oxygen, carbon, hydrocarbons, or a combination thereof. The capping layer 408 according to an embodiment interacts with the contaminants to neutralize them.

In one or more embodiments, a process of manufacturing an extreme ultraviolet (EUV) mask blank is provided. The process comprises forming a multilayer stack of reflective layers on a substrate by depositing alternating molybdenum and silicon layers on the substrate.

According to one or more embodiments, a substrate is provided that can be formed by a laser-based surface re-melting process to smooth pits and scratches on a substrate surface. The substrate is an ultralow defect substrate for EUV multilayer deposition to reduce total defects (especially phase defects) in EUV mask blanks. One or more embodiments, utilizing a laser-based surface re-melting process provides smooth surface with a low roughness of Ra less than 1 nm, less than 0.09 nm, less than 0.08 nm, and less than 0.07 nm. One or more embodiments provides a laser-based surface re-melting process with a metal smoothing layer which covers not only pits and scratches but also bumps and particles, forming a defect-free smooth surface with low roughness for EUV mask blank manufacture. Embodiments of a thermal-based surface re-melting process via rapid thermal processing (RTP) is cover all defects including pits, scratches, bumps and particles and form a defect-free smooth surface on metal assisting layer for EUV mask blank manufacture.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an extreme ultraviolet (EUV) mask blank, the method comprising:
   depositing a metal smoothing layer on a glass substrate having a first end and a second end and a softening temperature, the glass substrate comprising convex defects, including bumps and particles, and concave defects, including pits and scratches;
   scanning a surface of a glass substrate having the metal smoothing layer thereon with a laser from the first end to the second;

melting the metal smoothing layer to form a molten mass to fill the concave defects and cover the convex defects; and cooling the molten mass and forming a cooled, smooth surface.

2. The method of claim 1, wherein the cooled, smooth surface has an average roughness of less than 0.1 nm.

3. The method of claim 1, wherein the metal smoothing layer has a thickness in a range of from 2 nm to 50 nm.

4. The method of claim 1, wherein the metal smoothing layer comprises a metal having a melting point that is of from 200 to 400° C. lower than the softening point temperature of the glass substrate.

5. The method of claim 4, comprises a metal selected from the group consisting of zinc, aluminum, brass, magnesium, silver, copper and alloys thereof.

6. The method of claim 1, wherein the cooled, smooth surface has an average roughness of less than 0.1 nm.

7. The method of claim 1, wherein the glass substrate is rotated at a speed in a range of 20 to 200 rotations per minute.

8. The method of claim 1, wherein the surface of the glass substrate is scanned three times.

9. A method of manufacturing an extreme ultraviolet (EUV) mask blank, the method comprising:

depositing a metal smoothing layer on a glass substrate having a first end and a second end and a softening temperature, the glass substrate comprising convex and concave defects;

melting the metal smoothing layer from the first end to the second end to form a molten mass to fill the concave defects and cover the convex defects; and cooling the glass substrate to form a cooled, smooth surface.

10. The method of claim 9, wherein the melting the metal smoothing layer is performed in rapid thermal processing chamber.

11. The method of claim 10, wherein the metal smoothing layer comprises a metal having a melting point that is of from 200 to 400° C. lower than the softening point temperature of the glass substrate.

12. The method of claim 11, wherein the metal smoothing layer comprises a metal selected from the group consisting of brass, magnesium, silver, copper and alloys thereof.

13. The method of claim 11, wherein the cooled, smooth surface has an average roughness of less than 0.1 nm.

14. The method of claim 11, wherein the glass substrate further comprises convex and concave defects, and the metal smoothing layer covers the convex and concave defects so that the cooled, smooth surface has an average roughness of less than 0.1 nm.

15. The method of claim 11, wherein the metal smoothing layer is heated to a temperature in a range of from 400° C. to 1100° C. at a heating ramp rate exceeding 100° C./second.

16. The method of claim 15, wherein the metal smoothing layer is heated to a temperature in a range of from 400° C. to 1100° C. from 5 seconds to 10 minutes.

17. The method of claim 9, wherein the surface of the glass substrate is scanned three times.

18. An extreme ultraviolet mask blank comprising:

a glass substrate comprising a first end and a second end and a softening point temperature, the glass substrate comprising convex and concave defects;

a metal smoothing layer covering the EUV mask blank from the first end to the second end and the convex and concave defects, wherein the metal smoothing layer comprises a metal having a melting point that is of from 200 to 400° C. lower than the softening point temperature of the glass substrate, wherein the average roughness of the metal smoothing layer is less than 0.1 nm; and a multilayer stack reflective of EUV radiation on the metal smoothing layer.

19. The extreme ultraviolet mask blank of claim 18, wherein the metal smoothing layer comprises a metal selected from the group consisting of zinc, aluminum, brass, magnesium, silver, copper and alloys thereof.

20. The extreme ultraviolet mask blank of claim 19, wherein the multilayer stack comprises alternating layers of silicon and molybdenum.

\* \* \* \* \*